US011602061B2

(12) United States Patent
Rapinoja et al.

(10) Patent No.: US 11,602,061 B2
(45) Date of Patent: Mar. 7, 2023

(54) ELECTRONICS ENCLOSURE ARRANGEMENT FOR AN ELECTRIC DEVICE AND AN ELECTRIC DEVICE

(71) Applicant: ABB Schweiz AG, Baden (CH)

(72) Inventors: Hanna Rapinoja, Helsinki (FI); Pertti Seväkivi, Helsinki (FI); Teemu Salmia, Helsinki (FI)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 17/323,411

(22) Filed: May 18, 2021

(65) Prior Publication Data

US 2021/0368638 A1 Nov. 25, 2021

(30) Foreign Application Priority Data

May 25, 2020 (EP) .................................... 20176282

(51) Int. Cl.
*H05K 5/02* (2006.01)
*H05K 5/00* (2006.01)

(52) U.S. Cl.
CPC ......... *H05K 5/0217* (2013.01); *H05K 5/0026* (2013.01)

(58) Field of Classification Search
CPC .. H05K 5/0217; H05K 5/0026; H05K 7/1432; H05K 7/14; H05K 7/12; H05K 5/0209; H05K 5/02; H02B 1/28; H02K 5/136; A62C 3/16; A62C 35/10
See application file for complete search history.

(56) References Cited

U.S. PATENT DOCUMENTS 4,169,918 A 10/1979 Moore
4,751,154 A * 6/1988 Binder ................. H01M 10/52
429/57

(Continued)

FOREIGN PATENT DOCUMENTS

CN 206280106 U 6/2017
CN 110915311 A 3/2020
WO 03006870 A1 1/2003

OTHER PUBLICATIONS

European Search Report; Application No. EP 20 17 6282; dated Nov. 6, 2020; 2 pages.

(Continued)

*Primary Examiner* — Hung S. Bui
*Assistant Examiner* — Sagar Shrestha
(74) *Attorney, Agent, or Firm* — Whitmyer IP Group LLC

(57) ABSTRACT

A field of enclosures for electronics and electrical components within electric devices, such as electric drive devices for industrial applications, e.g. for working machine and marine applications, and more particularly to an electronics enclosure arrangement for an electric device, and to an electric device. The electronics enclosure arrangement according to the present invention is arranged for an electric device, the electric device including one or more circuit boards and electronics components assembled on the one or more circuit boards, wherein the electronics enclosure arrangement includes an electronics enclosure cover; and an at least one volume element part, arranged in the space between the electronics enclosure cover and the one or more circuit boards with the electronics components.

15 Claims, 7 Drawing Sheets

(56) References Cited

U.S. PATENT DOCUMENTS

| | | | |
|---|---|---|---|
| 4,859,546 A * | 8/1989 | Binder | H01M 50/383 |
| | | | 429/57 |
| 5,045,085 A * | 9/1991 | Binder | H01M 50/383 |
| | | | 429/53 |
| 5,173,374 A * | 12/1992 | Tiedemann | H01M 50/383 |
| | | | 429/57 |
| 5,178,973 A * | 1/1993 | Binder | H01M 10/52 |
| | | | 429/57 |
| 10,564,524 B2 * | 2/2020 | Sugiyama | G06F 1/163 |
| 2002/0173199 A1 * | 11/2002 | Liegl | H05K 5/064 |
| | | | 174/92 |
| 2007/0041160 A1 * | 2/2007 | Kehret | H05K 7/20445 |
| | | | 361/704 |
| 2018/0220559 A1 * | 8/2018 | Lerner | B32B 9/045 |
| 2018/0263133 A1 * | 9/2018 | Lu | G06F 1/1656 |
| 2020/0033068 A1 * | 1/2020 | Endoh | H05K 7/20336 |
| 2020/0098663 A1 * | 3/2020 | Sugiyama | C08L 93/00 |
| 2020/0113076 A1 | 4/2020 | Hermanowski et al. | |
| 2021/0037665 A1 * | 2/2021 | Wang | B32B 15/20 |
| 2021/0307213 A1 * | 9/2021 | Kim | G02F 1/133628 |

OTHER PUBLICATIONS

Chinese Office Action and Search Report; Application No. 202110511961.9; dated Aug. 11, 2022; 21 Pages.

\* cited by examiner

ELECTRONICS ENCLOSURE ARRANGEMENT FOR AN ELECTRIC DEVICE AND AN ELECTRIC DEVICE

TECHNICAL FIELD

The present invention relates to the field of enclosures for electronics and electrical components within electric devices, such as electric drive devices for industrial applications, e.g. for working machine and marine applications, and more particularly to an electronics enclosure arrangement for an electric device, and to an electric device.

BACKGROUND

Electric devices, such as electric drive devices, are widely used for industrial applications, e.g. for providing and controlling electrical power and energy to various public and industrial applications as well as for driving and controlling various public and industrial applications. These applications include devices for transport vehicle engines, different process and manufacturing technological devices, and devices in energy industry as well as industrial electric drives. Electric drive devices may also be referred to as power electronic devices as they typically include a number of power electronic components.

Within electric devices, such as fixed and mobile electric drive devices, industrial electric drives are used for various applications, such as transport vehicle engines, different process and manufacturing technological devices and in energy industry. As regards transport devices, electric drives may be used in underground railway service or shipping service, for example. In process and manufacturing technology electric drives may be used e.g. in conveyors, mixers or in paper machines, for instance. In energy industry, electric drives may be used in turbines of wind power industry or in solar power industry, for example. A mobile electric drive device may be used for driving and controlling machinery and process equipment in demanding working conditions, e.g. in factories, in quarries, in mines and in offshore conditions. A mobile electric drive device may be used both in an inverter mode and in a DC/DC mode.

Typically, electric devices, such as electric drive devices or power electronic devices, have totally closed enclosures, e.g. closed steel sheet enclosures or closed plastic/composite enclosures, for shielding electronics, electrical components and power electronic components, such as steel sheet enclosures for shielding power electronic components. Said totally closed enclosures typically protect the electronics, electrical components and power electronic components from dust, water and other environmental conditions in demanding working conditions, e.g. in factories, in quarries, in mines and in offshore conditions.

Every now and then, especially in demanding conditions, there may occur fault situations in an electric device. For example, an electric arc discharge may cause pressure build-up inside a closed electronics enclosure and may lead to inflammation of combustible gases such as carbon hydride gases. This in turn may cause a breakage of the electronics enclosure and may even cause a serious danger to the user.

In the following, the prior art will be described with reference to the accompanying drawing of FIG. 1, which illustrates a perspective front view of an electric device according to the prior art.

FIG. 1 illustrates a perspective front view of an electric device according to the prior art without an electronics enclosure cover. The presented electric device 1 according to the prior art is a mobile electric drive device. The presented electric device 1 has a front panel 11 with connectors 12-14. Behind the front panel 11 the electric device 1 according to the prior art has one or more circuit boards 15 and electronics components 16, 17 assembled on said one or more circuit boards 15. The presented electric device 1 according to the prior art also has internal compartments 18, 19 for other electric circuitry arranged separate from said one or more circuit boards 15 and electronics components 16, 17.

Every now and then, especially in demanding conditions, there may occur fault situations in an electric device 1. In the presented electric device 1 according to the prior art, in a fault situation, there is a possibility for an electric arc to occur in said one or more circuit boards 15 and in said electronics components 16, 17. For example, an electric arc discharge may cause pressure build-up inside a closed electronics enclosure and may lead to inflammation of combustible gases such as carbon hydride gases. This in turn may cause a breakage of the electronics enclosure and may even cause a serious danger to the user.

There are problems with prior art electronics enclosure arrangements of an electric device as in case of a fault situation occurring in said electric device, the inflamed combustible gases typically lead to breakage of the electronics enclosure. In some cases, the breakage of the electronics enclosure of said electric device is severe and cause a serious danger to the user near said electric device.

Consequently, there is clearly a need and demand for an electronics enclosure arrangement of an electric device and for an electric device that in an electric arc discharge fault reduces the pressure build-up inside an electronics enclosure, reduces the risk of a breakage of the electronics enclosure of said electric device and provides a better user safety in case of a fault situation.

SUMMARY

The object of the invention is to introduce an electronics enclosure arrangement for an electric device and to introduce an electric device, which provide a better user safety in case of a fault situation. Advantageous embodiments are furthermore presented.

It is brought forward a new electronics enclosure arrangement for an electric device, said electric device comprising one or more circuit boards and electronics components assembled on said one or more circuit boards, wherein said electronics enclosure arrangement comprises an electronics enclosure cover; and an at least one volume element part arranged in the space between said electronics enclosure cover and said one or more circuit boards with said electronics components. Hereby, one or more of the above-mentioned advantages and/or objectives are achieved. These advantages and/or objectives are further facilitated with the additional preferred features and/or steps described in the following.

In a preferred embodiment, said at least one volume element part comprises an at least one bubble structure sheet, said at least one bubble structure sheet having a sheet frame with one or more bubbles arranged within said sheet frame.

In a preferred embodiment, said at least one volume element part comprises an at least one pillow structure sheet, said at least one pillow structure sheet having an at least partly hollow structure consisting of one or more pillows arranged inside said at least one pillow structure sheet.

In a preferred embodiment, said at least one volume element part comprises one or more bubble structure sheets and/or one or more pillow structure sheets, which sheets are cut to a specific size to fit in the space between said electronics enclosure cover and said one or more circuit boards with said electronics components.

In a preferred embodiment, said at least one volume element part comprises one or more bubble structure sheets and/or one or more pillow structure sheets, which sheets are stuffed, rolled or bent to fit in the space between said electronics enclosure cover and said one or more circuit boards with said electronics components.

In a preferred embodiment, said at least one volume element part is manufactured of pressure-proof material.

In a preferred embodiment, said at least one volume element part is manufactured of heat-resistant material.

In a preferred embodiment, said at least one volume element part is manufactured of insulating material.

In a preferred embodiment, said at least one volume element part is manufactured of a lightweight material.

In a preferred embodiment, said one or more bubbles and/or said one or more pillows comprise inert gas.

In a preferred embodiment, said one or more bubbles and/or said one or more pillows comprise a mixture arranged for displacing the oxygen concentration in air.

In a preferred embodiment, said one or more bubbles and/or said one or more pillows comprise a mixture of chemical fire suppressants or a mixture arranged for reducing the temperature in a chemical reaction.

In a preferred embodiment, said one or more bubbles and/or said one or more pillows comprise a mixture of chemical substances arranged for chemically adsorbing hazardous gases.

Furthermore, it is brought forward a new electric device, said electric device comprising one or more circuit boards and electronics components assembled on said one or more circuit boards, wherein said electric device comprises an electronics enclosure arrangement comprising an electronics enclosure cover; and an at least one volume element part arranged in the space between said electronics enclosure cover and said one or more circuit boards with said electronics components. Hereby, one or more of the above-mentioned advantages and/or objectives are achieved. These advantages and/or objectives are further facilitated with the additional preferred features and/or steps described in the following.

In a preferred embodiment, said electric device is a mobile electric drive device.

BRIEF DESCRIPTION OF THE DRAWINGS

In the following, the present invention will be described in more detail by way of example and with reference to the attached drawings, in which.

The foregoing aspects, features and advantages of the invention will be apparent from the drawings and the detailed description related thereto.

Figure 1:
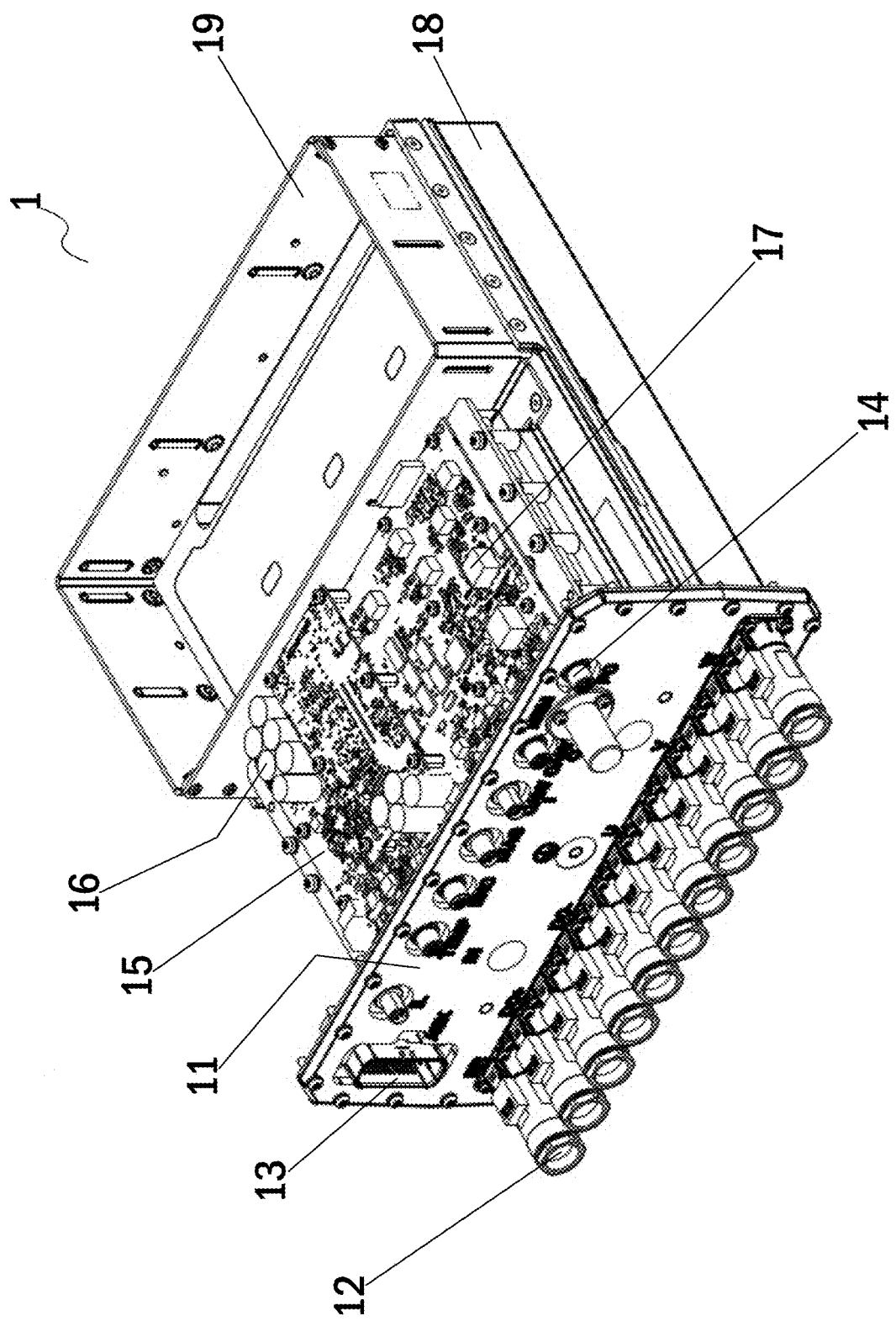
FIG. 1 illustrates a perspective front view of an electric device according to the prior art without an electronics enclosure cover.

The prior art drawing of FIG. 1 has been presented earlier. In the following, the invention will be described in greater detail by means of preferred embodiments with reference to the accompanying drawings of FIGS. 2 to 7.

DETAILED DESCRIPTION

The electronics enclosure arrangement according to one embodiment of the present invention is arranged for an electric device, said electric device comprising one or more circuit boards and electronics components assembled on said one or more circuit boards, wherein said electronics enclosure arrangement comprises an electronics enclosure cover; and an at least one volume element part arranged in the space between said electronics enclosure cover and said one or more circuit boards with said electronics components.

In electric devices, the circuit boards and the electronics components assembled on said circuit boards are typically enclosed with an electronics enclosure cover. Within power electronics, for example, electric devices with high power density are manufactured, in which the power electronic components are enclosed with an electronics enclosure cover. The electronics enclosure cover shields the power electronic components electric device from dust, water and other environmental conditions in demanding working conditions, e.g. in factories, in quarries, in mines and in offshore conditions.

In electric arc fault conditions, the high-power density of an electric device may cause high pressure build-up inside an enclosed electronics enclosure cover. Furthermore, an electric arc discharge may lead to inflammation of combustible gases such as carbon hydride gases.

In electric devices, the electronics components may comprise film capacitors having a thin insulating film as a dielectric medium between the anode and the cathode. The material of the insulating film affects substantially the characteristics of the film capacitor. The insulating film may be made of glass or as in most cases of plastic. The most used plastics for an insulating film are polypropylene (PP), polyester (PET), polyphenylene sulfide (PPS), polyethylene naphthalate (PEN) ja polytetrafluoroethylene (PTFE). The film capacitors used in power electronics applications are typically polypropylene film capacitors, due to the high dielectric strength of polypropylene.

The melting point of polypropylene is about 160° C. and a breakdown of a polypropylene film typically occurs as the temperature rises above 300° C. The film capacitor can break down due to an excessive voltage and/or due to an excessive temperature. Furthermore, the film capacitor can break down because of an unsuccessful self-healing process. When breaking down the polypropylene film produces carbon hydride gases.

Oxygen is always needed for combustible gases to catch fire. Furthermore, the combustible gases need to have a certain concentration percentage of the total air volume in order to catch fire. With carbon hydride gases, this concentration percentage of the total air volume is from 1% to 15%.

As an electric arc discharge occurs the air surrounding the electric arc heats up and expands explosively. The rapidly expanding air may cause pressure build-up inside the closed electronics enclosure and leads to inflammation of carbon hydride gases. This in turn causes a breakage of the electronics enclosure and causes a serious danger to the user.

In order to reduce the free air volume inside the closed electronics enclosure, according to the present invention, there is provided an at least one volume element part arranged in the space between said electronics enclosure cover and said one or more circuit boards with said electronics components.

Figure 2:
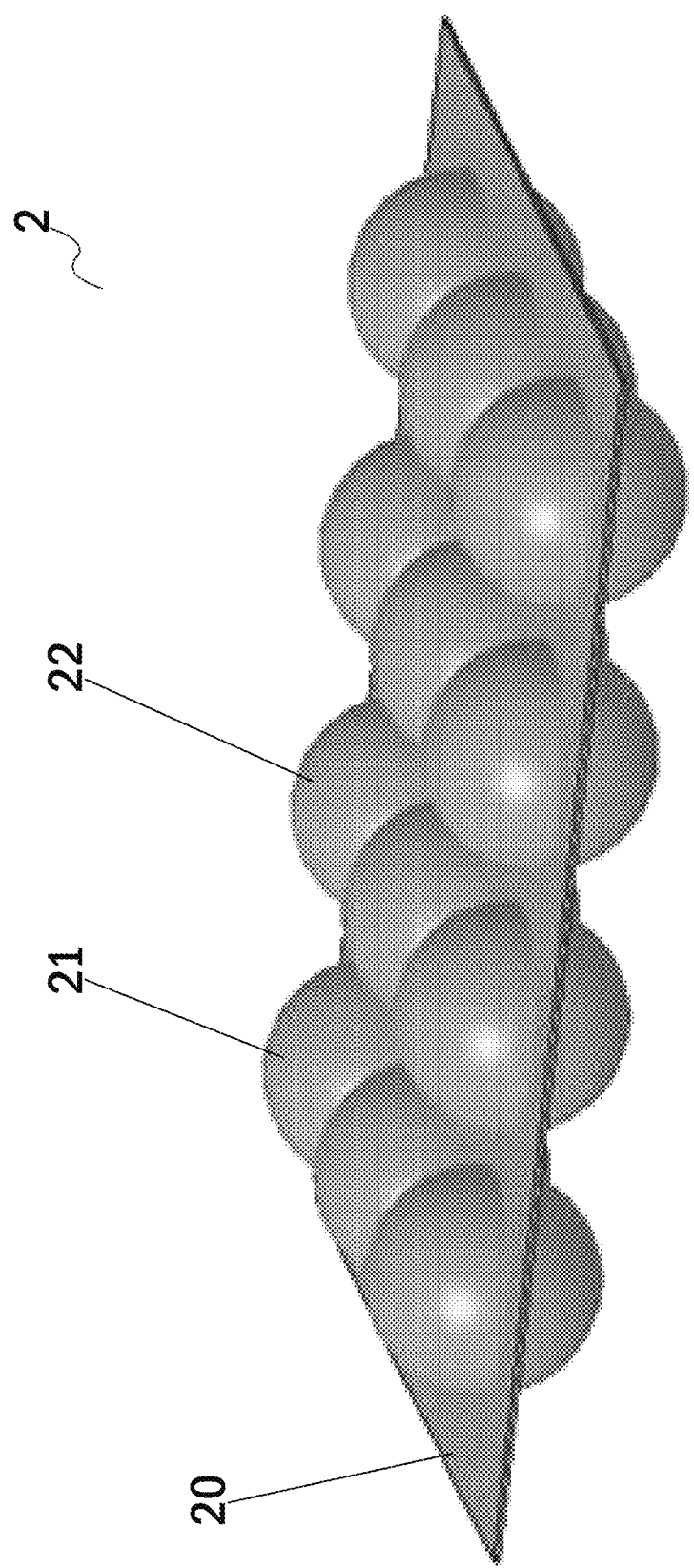
FIG. 2 illustrates a perspective view of an embodiment of a volume element part of the electronics enclosure arrangement according to the present invention.

FIG. 2 illustrates a perspective view of an embodiment of a volume element part of the electronics enclosure arrangement according to the present invention. The embodiment of a volume element part 2 presented in FIG. 2 is a bubble structure sheet 2 having a sheet frame 20 with one or more bubbles 21, 22 arranged within said sheet frame 20.

Said volume element part 2 and said sheet frame 20 and said one or more bubbles 21, 22 may be manufactured of pressure-proof material, heat-resistant material and/or insulating material. Said volume element part 2 and said sheet frame 20 and said one or more bubbles 21, 22 may be manufactured of a lightweight material. The insulating material of said volume element part 2 and said sheet frame 20 and said one or more bubbles 21, 22 allows the volume element part 2 to be in contact with live parts, i.e. with energized parts such as busbars. The bubble structure sheet 2 according to the presented embodiment comprises one or more bubbles 21, 22, which one or more bubbles 21, 22 may comprise air or oxygen. When said one or more bubbles 21, 22 comprise air or oxygen said one or more bubbles 21, 22 may be manufactured of pressure-proof material said pressure-proof material being able to withstand the initial pressure build-up inside the closed electronics enclosure.

The bubble structure sheet 2 according to the presented embodiment comprises one or more bubbles 21, 22, which one or more bubbles 21, 22 may comprise inert gas, i.e. non-reactive gas. Furthermore, said one or more bubbles 21, 22 may comprise a mixture displacing the oxygen concentration in air and thus extinguishing the fire. Furthermore, said one or more bubbles 21, 22 may comprise a mixture of chemical fire suppressants or a mixture reducing the temperature in a chemical reaction. Furthermore, said one or more bubbles 21, 22 may comprise a mixture of chemical substances chemically adsorbing hazardous gases. Furthermore, said one or more bubbles 21, 22 may comprise a mixture comprising some or all of the abovementioned gases/mixtures. When said one or more bubbles 21, 22 comprise inert gas, a mixture displacing the oxygen concentration in air, a mixture of chemical fire suppressants, a mixture reducing the temperature in a chemical reaction or a mixture of chemical substances chemically adsorbing hazardous gases, said one or more bubbles 21, 22 may be manufactured of material allowing said one or more bubbles 21, 22 to burst due to the initial pressure build-up inside the closed electronics enclosure.

Figure 3:
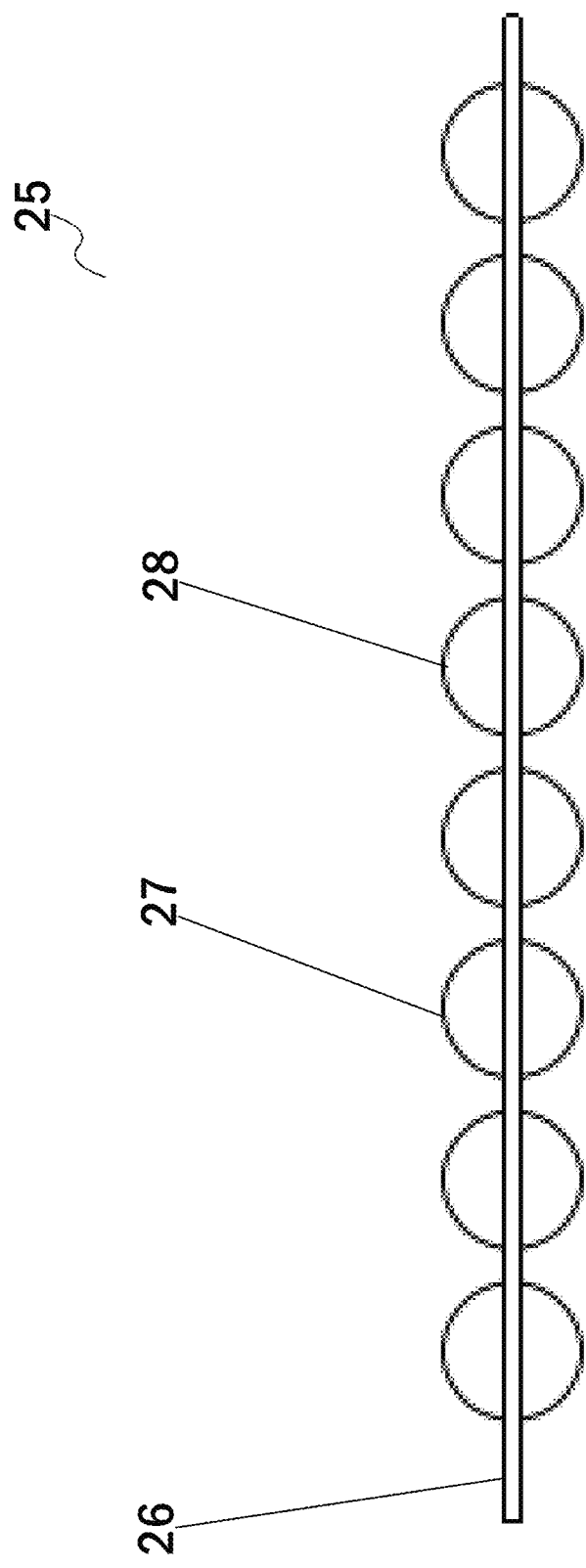
FIG. 3 illustrates a front side view of another embodiment of a volume element part of the electronics enclosure arrangement according to the present invention.

FIG. 3 illustrates a front side view of another embodiment of a volume element part of the electronics enclosure arrangement according to the present invention. The another embodiment of a volume element part 25 presented in FIG. 3 is a bubble structure sheet 25 having a sheet frame 26 with one or more bubbles 27, 28 arranged within said sheet frame 26.

Said volume element part 25 and said sheet frame 26 and said one or more bubbles 27, 28 may be manufactured of pressure-proof material, heat-resistant material and/or insulating material. Said volume element part 25 and said sheet frame 26 and said one or more bubbles 27, 28 may be manufactured of a lightweight material. The insulating material of said volume element part 25 and said sheet frame 26 and said one or more bubbles 27, 28 allows the volume element part 25 to be in contact with live parts, i.e. with energized parts such as busbars. The bubble structure sheet 25 according to the presented embodiment comprises one or more bubbles 27, 28, which one or more bubbles 27, 28 may comprise air or oxygen. When said one or more bubbles 27, 28 comprise air or oxygen said one or more bubbles 27, 28 may be manufactured of pressure-proof material said pressure-proof material being able to withstand the initial pressure build-up inside the closed electronics enclosure.

The bubble structure sheet 25 according to the presented embodiment comprises one or more bubbles 27, 28, which one or more bubbles 27, 28 may comprise inert gas, i.e. non-reactive gas. Furthermore, said one or more bubbles 27, 28 may comprise a mixture displacing the oxygen concentration in air and thus extinguishing the fire. Furthermore, said one or more bubbles 27, 28 may comprise a mixture of chemical fire suppressants or a mixture reducing the temperature in a chemical reaction. Furthermore, said one or more bubbles 27, 28 may comprise a mixture of chemical substances chemically adsorbing hazardous gases. Furthermore, said one or more bubbles 27, 28 may comprise a mixture comprising some or all of the abovementioned gases/mixtures. When said one or more bubbles 27, 28 comprise inert gas, a mixture displacing the oxygen concentration in air, a mixture of chemical fire suppressants, a mixture reducing the temperature in a chemical reaction or a mixture of chemical substances chemically adsorbing hazardous gases, said one or more bubbles 27, 28 may be manufactured of material allowing said one or more bubbles 27, 28 to burst due to the initial pressure build-up inside the closed electronics enclosure.

Figure 4:
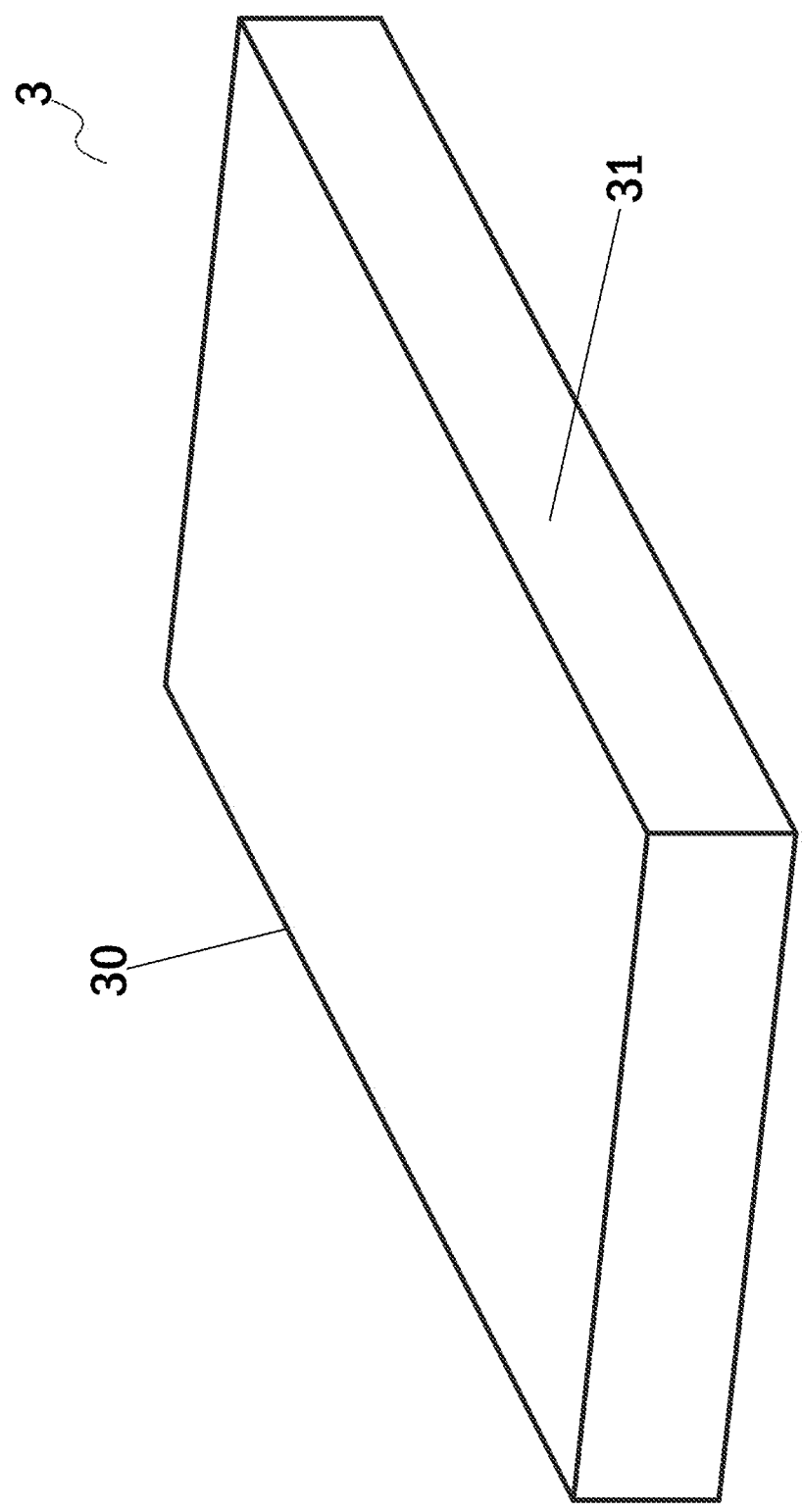
FIG. 4 illustrates a perspective view of a third embodiment of a volume element part of the electronics enclosure arrangement according to the present invention.

FIG. 4 illustrates a perspective view of a third embodiment of a volume element part of the electronics enclosure arrangement according to the present invention. The third embodiment of a volume element part 3 presented in FIG. 4 is a single sheet 3 consisting of a pillow structure sheet 30 with at least partly hollow structure consisting of one or more pillows 31 arranged inside said pillow structure sheet 30.

Said volume element part 3, said pillow structure sheet 30, and said one or more pillows 31 may be manufactured of pressure-proof material, heat-resistant material and/or insulating material. Said volume element part 3, said pillow structure sheet 30, and said one or more pillows 31 may be manufactured of a lightweight material. The insulating material of said volume element part 3, said pillow structure sheet 30, and said one or more pillows 31 allows the volume element part 3 to be in contact with live parts, i.e. with energized parts such as busbars. The single sheet 3 according to the presented embodiment comprises one or more pillows 31, which one or more pillows 31 may comprise air or oxygen. When said one or more pillows 31 comprise air or oxygen said one or more pillows 31 may be manufactured of pressure-proof material said pressure-proof material being able to withstand the initial pressure build-up inside the closed electronics enclosure.

The single sheet 3 according to the presented embodiment comprises one or more pillows 31, which one or more pillows 31 may comprise inert gas, i.e. non-reactive gas.

Furthermore, said one or more pillows 31 may comprise a mixture displacing the oxygen concentration in air and thus extinguishing the fire. Furthermore, said one or more pillows 31 may comprise a mixture of chemical fire suppressants or a mixture reducing the temperature in a chemical reaction. Furthermore, said one or more pillows 31 may comprise a mixture of chemical substances chemically adsorbing hazardous gases. Furthermore, said one or more pillows 31 may comprise a mixture comprising some or all of the abovementioned gases/mixtures. When said one or more pillows 31 comprise inert gas, a mixture displacing the oxygen concentration in air, a mixture of chemical fire suppressants, a mixture reducing the temperature in a chemical reaction or a mixture of chemical substances chemically adsorbing hazardous gases, said one or more pillows 31 may be manufactured of material allowing said one or more pillows 31 to burst due to the initial pressure build-up inside the closed electronics enclosure.

Figure 5:
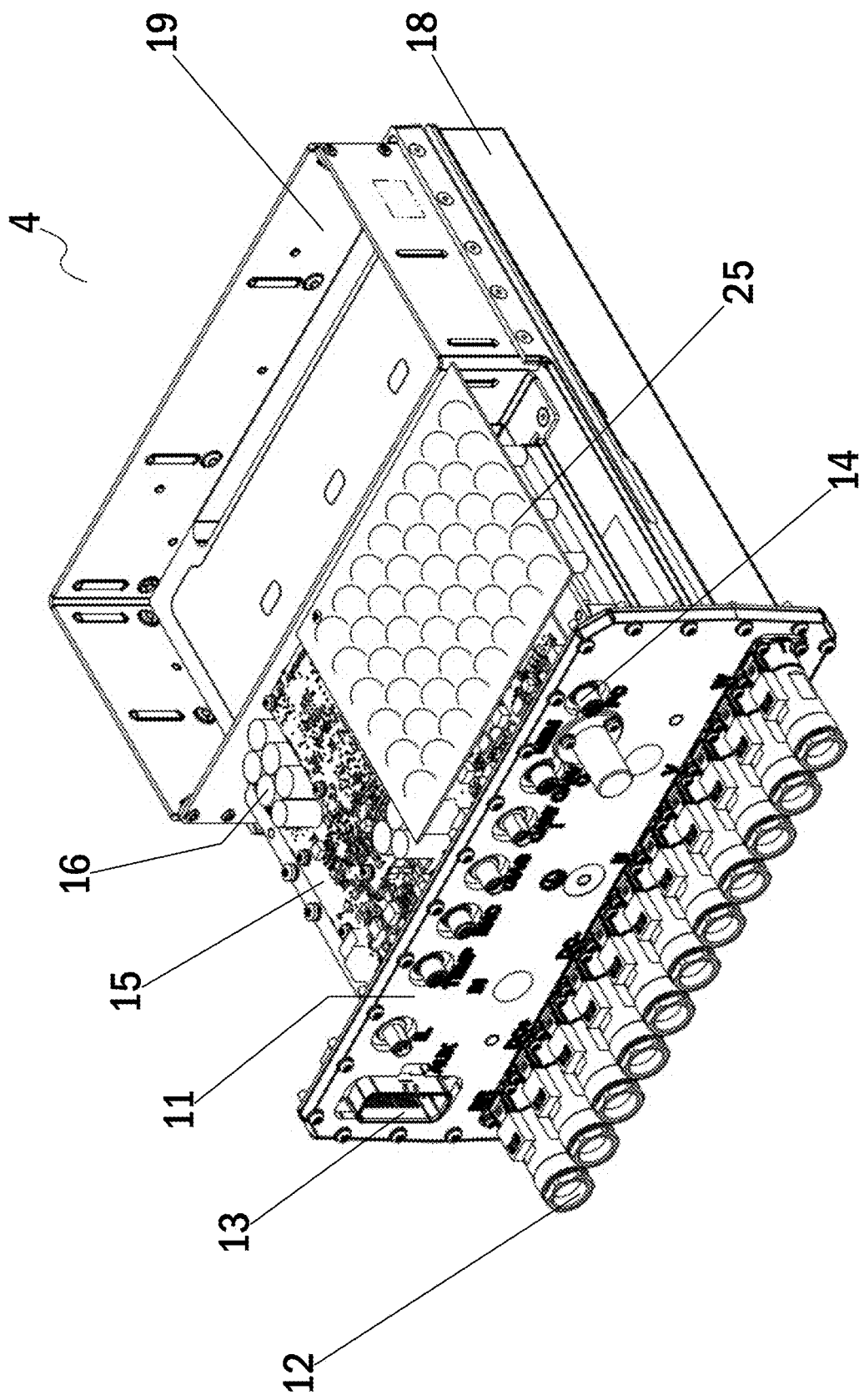
FIG. 5 illustrates a perspective front view of an embodiment of an electric device according to the present invention without an electronics enclosure cover.

FIG. 5 illustrates a perspective front view of an embodiment of an electric device according to the present invention without an electronics enclosure cover. The presented electric device 4 according to the presented embodiment is a mobile electric drive device. The electric device 4 according to one embodiment of the present invention has a front panel 11 with connectors 12-14. Behind the front panel 11 the electric device 4 according to the presented embodiment has one or more circuit boards 15 and electronics components 16 assembled on said one or more circuit boards 15. The presented electric device 4 according to the present invention also has internal compartments 18, 19 for other electric circuitry arranged separate from said one or more circuit boards 15 and electronics components 16.

The electric device 4 according to an embodiment of the present invention also has an electronics enclosure arrangement comprising a volume element part 25 and an electronics enclosure cover, which electronics enclosure cover is not shown in FIG. 5. Said volume element part 25 is a bubble structure sheet 25 having a sheet frame with one or more bubbles arranged within said sheet frame. In the electric device 4 according to the presented embodiment the volume element part 25 is specifically to fit in a space above certain components. In this case said volume element part 25 is specifically designed to reduce the free air volume of the components near which it is arranged.

Said volume element part 25 and said sheet frame and said one or more bubbles may be manufactured of pressure-proof material, heat-resistant material and/or insulating material. Said volume element part 25 and said sheet frame and said one or more bubbles may be manufactured of a lightweight material. The bubble structure sheet 25 according to the presented embodiment comprises one or more bubbles, which one or more bubbles may comprise air or oxygen. When said one or more bubbles comprise air or oxygen said one or more bubbles may be manufactured of pressure-proof material said pressure-proof material being able to withstand the initial pressure build-up inside the closed electronics enclosure.

The bubble structure sheet 25 according to the presented embodiment comprises one or more bubbles, which may comprise inert gas, i.e. non-reactive gas. Furthermore, said one or more bubbles may comprise a mixture displacing the oxygen concentration in air and thus extinguishing the fire. Furthermore, said one or more bubbles may comprise a mixture of chemical fire suppressants or a mixture reducing the temperature in a chemical reaction. Furthermore, said one or more bubbles may comprise a mixture of chemical substances chemically adsorbing hazardous gases. Furthermore, said one or more bubbles may comprise a mixture comprising some or all of the abovementioned gases/mixtures. When said one or more bubbles comprise inert gas, a mixture displacing the oxygen concentration in air, a mixture of chemical fire suppressants, a mixture reducing the temperature in a chemical reaction or a mixture of chemical substances chemically adsorbing hazardous gases, said one or more bubbles may be manufactured of material allowing said one or more bubbles to burst due to the initial pressure build-up inside the closed electronics enclosure.

In case of an electric arc fault condition, a film capacitor can break down due to an excessive voltage and/or due to an excessive temperature. Furthermore, the film capacitor can break down because of an unsuccessful self-healing process. When breaking down the polypropylene film produces carbon hydride gases. Oxygen is always needed for combustible gases to catch fire. Furthermore, the combustible gases need to have a certain concentration percentage of the total air volume in order to catch fire. With carbon hydride gases, this concentration percentage of the total air volume is from 1% to 15%.

As the electronics enclosure arrangement of the electric device 4 according to an embodiment of the present invention has a volume element part 25 substantially reducing the free air volume near the broken-down components. As the free air volume near the broken-down components is substantially reduced, the carbon hydride gas concentration percentage of the total air volume rapidly increases above 15%, this thereby preventing the inflammation of the carbon hydride gases.

When an electric arc discharge occurs, the air surrounding the electric arc heats up and expands rapidly. The rapidly expanding air causes pressure build-up inside the closed electronics enclosure and may lead to inflammation of carbon hydride gases. As in the embodiment of the present invention the free air volume near the broken-down components is substantially reduced, the possible explosive energy amount is likewise substantially reduced and the possible consequences of pressure expansion are substantially reduced. This substantially reduces a risk of a serious danger to the user in case of a breakage of the electronics enclosure.

Figure 6:
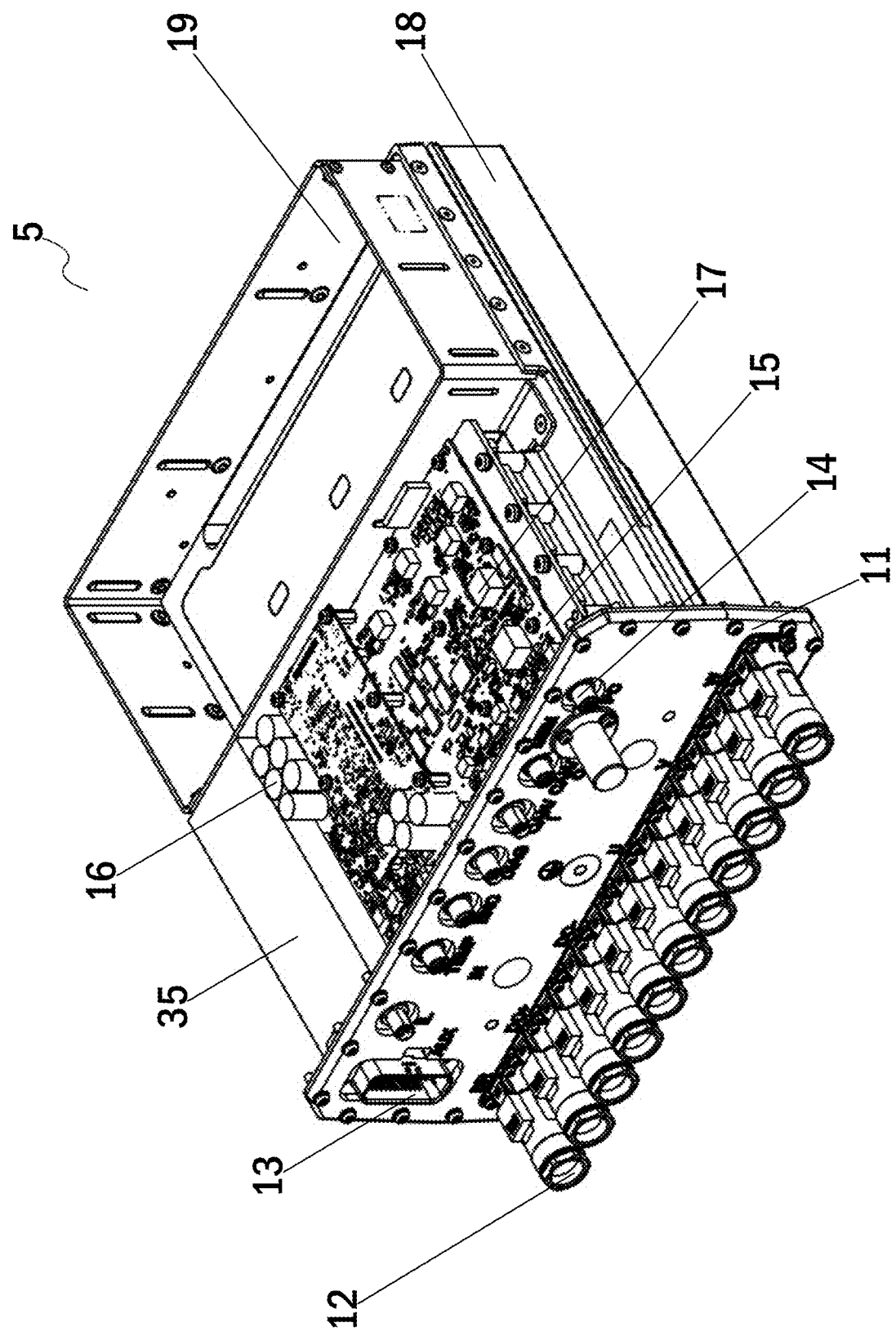
FIG. 6 illustrates a perspective front view of another embodiment of an electric device according to the present invention without an electronics enclosure cover.

FIG. 6 illustrates a perspective front view of another embodiment of an electric device according to the present invention without an electronics enclosure cover. The presented electric device 5 according to the presented another embodiment is a mobile electric drive device. The electric device 5 according to another embodiment of the present invention has a front panel 11 with connectors 12-14. Behind the front panel 11 the electric device 5 according to the presented another embodiment has one or more circuit boards 15 and electronics components 16, 17 assembled on said one or more circuit boards 15. The presented electric device 5 according to the present invention also has internal compartments 18, 19 for other electric circuitry arranged separate from said one or more circuit boards 15 and electronics components 16, 17.

The electric device 5 according to another embodiment of the present invention also has an electronics enclosure arrangement comprising a volume element part 35 and an electronics enclosure cover, which electronics enclosure cover is not shown in FIG. 6. Said volume element part 35 is a pillow structure sheet 35 having one or more pillows arranged within said pillow structure sheet. In the electric device 5 according to the presented another embodiment the volume element part 35 is specifically to fit in a space above certain components. In this case said volume element part 35 is specifically designed to reduce the free air volume of the components near which it is arranged.

Said pillow structure sheet 35 and said one or more pillows may be manufactured of pressure-proof material, heat-resistant material and/or insulating material. Said pillow structure sheet 35 and said one or more pillows may be manufactured of a lightweight material. The bubble structure sheet 35 according to the presented embodiment comprises one or more pillows, which one or more pillows may comprise air or oxygen. When said one or more pillows comprise air or oxygen said one or more pillows may be manufactured of pressure-proof material said pressure-proof material being able to withstand the initial pressure build-up inside the closed electronics enclosure.

The pillow structure sheet 35 according to the presented embodiment comprises one or more pillows, which may comprise inert gas, i.e. non-reactive gas. Furthermore, said one or more pillows may comprise a mixture displacing the oxygen concentration in air and thus extinguishing the fire. Furthermore, said one or more pillows may comprise a mixture of chemical fire suppressants or a mixture reducing the temperature in a chemical reaction. Furthermore, said one or more pillows may comprise a mixture of chemical substances chemically adsorbing hazardous gases. Furthermore, said one or more pillows may comprise a mixture comprising some or all of the abovementioned gases/mixtures. When said one or more pillows comprise inert gas, a mixture displacing the oxygen concentration in air, a mixture of chemical fire suppressants, a mixture reducing the temperature in a chemical reaction or a mixture of chemical substances chemically adsorbing hazardous gases, said one or more pillows may be manufactured of material allowing said one or more pillows to burst due to the initial pressure build-up inside the closed electronics enclosure.

As the electronics enclosure arrangement of the electric device 5 according to an embodiment of the present invention has a volume element part 35 substantially reducing the free air volume near the broken-down components. As the free air volume near the broke-down components is substantially reduced, the carbon hydride gas concentration percentage of the total air volume rapidly increases above 15%, this thereby preventing the inflammation of the carbon hydride gases. When an electric arc discharge occurs, the air surrounding the electric arc heats up and expands rapidly. The rapidly expanding air causes pressure build-up inside the closed electronics enclosure and may lead to inflammation of carbon hydride gases. As in the embodiment of the present invention the free air volume near the broken-down components is substantially reduced, the possible explosive energy amount is likewise substantially reduced and the possible consequences of pressure expansion are substantially reduced. This substantially reduces a risk of a serious danger to the user in case of a breakage of the electronics enclosure.

Figure 7:
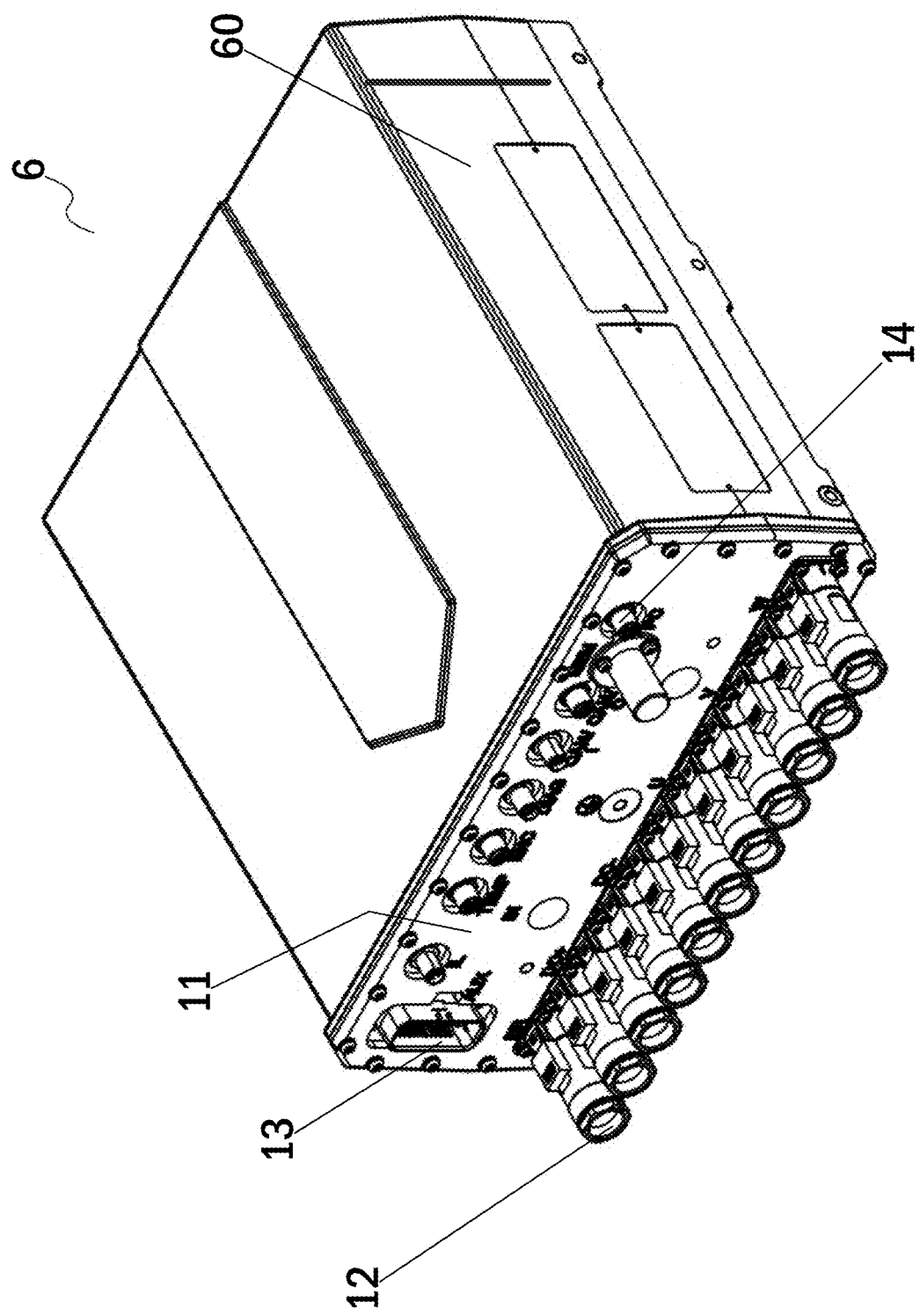
FIG. 7 illustrates a perspective front view of an embodiment of an electric device according to the present invention with an electronics enclosure cover.

FIG. 7 illustrates a perspective front view of an embodiment of an electric device according to the present invention with an electronics enclosure cover. The presented electric device 6 according to the presented embodiment is a mobile electric drive device. The electric device 6 according to an embodiment of the present invention has a front panel 11 with connectors 12-14. Behind the front panel 11, the electric device 6 according to the presented embodiment has one or more circuit boards and electronics components assembled on said one or more circuit boards.

The electric device 6 according to an embodiment of the present invention also has an electronics enclosure arrangement comprising an at least one volume element part and an electronics enclosure cover 60. Said at least one volume element part may comprise one or more bubble structure sheets and/or one or more pillow structure sheets. In the electric device 6 according to the presented embodiment said at least one volume element part is/are arranged in the space between said electronics enclosure cover 60 and said one or more circuit boards with electronics components.

Said at least one volume element part may comprise one or more bubble structure sheets and/or one or more pillow structure sheets, which sheets are cut to a specific size to fit in the space between said electronics enclosure cover 60 and said one or more circuit boards with electronics components.

Said at least one volume element part may comprise one or more bubble structure sheets and/or one or more pillow structure sheets, which sheets are stuffed, rolled or bent to fit in the space between said electronics enclosure cover 60 and said one or more circuit boards with electronics components.

In the electronics enclosure arrangement according to the present invention, the free air volume inside the closed electronics enclosure of the electric device this providing a number of advantages. As the most important advantage, the electronics enclosure arrangement for an electric device according to the present invention provides a better security for the user of the electric device.

When an electric arc discharge fault occurs, the electronics enclosure arrangement for an electric device according to the present invention reduces the explosive energy amount and substantially reduces or eliminates the possible consequences of pressure expansion and the risk of a breakage of the electronics enclosure of the electric device. The solution according to the present invention also provides a more predictable behavior in an electric arc discharge fault situation.

In a fault situation, combustible gases need to have a certain concentration percentage of the total air volume in order to catch fire. As in an electric device according to the present invention the free air volume near the broken-down components is substantially reduced, the carbon hydride gas concentration percentage of the total air volume increases rapidly above said certain concentration percentage of the total air volume, this thereby reducing or eliminating the risk of inflammation of the carbon hydride gases. This reduces the risk of a breakage of the electronics enclosure of the electric device and provides a better user safety in case of a fault situation.

As in an electric device according to the present invention the explosive energy amount in an electric arc discharge fault situation is substantially reduced. This allows the user to select less expensive and more straightforward components for safeguarding an electric arc discharge fault situation. The present invention allows a slower and more straightforward safeguarding even with a current. In some cases, the reduced explosive energy amount eliminates the risk of a breakage of the electronics enclosure of the electric device.

The electronics enclosure arrangement according to the present invention is very easy to assemble to the electric device. To easily fit in the space between the electronics enclosure cover and the one or more circuit boards with electronics components, in the electronics enclosure arrangement according to the present invention the bubble structure sheet/sheets and/or pillow structure sheet/sheets can be cut to a specific size. Furthermore, the bubble structure sheet/sheets and/or pillow structure sheet/sheets can be stuffed, rolled or bent to easily fit in the space between the electronics enclosure cover and the one or more circuit boards with electronics components.

The electronics enclosure arrangement according to the present invention can be used for shielding the electronics of any kind of electric device, such as a mobile electric drive device or any other electric device with electronics.

When referring to the term "volume element part", in this application it is meant to comprise any part manufactured of material that supersedes and reduces the free air volume of a certain space.

When referring to the terms "bubble structure sheet", "sheet frame" and "bubble", in this application "bubble structure sheet" is meant to comprise any sheet type material, i.e. having a "sheet frame", that comprises one or more embedded, integrated or included "bubbles", i.e. bubble-like hollow portions containing air/gas.

When referring to the terms "pillow structure sheet" and "pillow", in this application "pillow structure sheet" is meant to comprise any sheet type material that comprises or encloses one or more hollow portions, i.e. "pillows", containing air/gas.

When referring to "pressure-proof material", in this application it is meant to comprise any material that is able to withstand a pressure of at least 1.5 times an atmospheric pressure, preferable a pressure of at least 2.5 times an atmospheric pressure.

When referring to "heat-resistant material", in this application it is meant to comprise any material that is able to withstand a heat of at least 95 degrees, preferably a heat of at least 150 degrees, more preferably a heat of at least 250 degrees in the Celsius scale in a standard atmospheric pressure.

When referring to "insulating material", in this application it is meant to comprise any electrically insulating material that that has an electrical resistivity more than $10^9$ $\Omega$m, preferably an electrical resistivity more than $10^{15}$ $\Omega$m.

When referring to "lightweight material", in this application it is meant to comprise any material that has a density less than 2000 kg/m$^3$, preferably a density less than 1500 kg/m$^3$, more preferably a density less than 500 kg/m$^3$.

It is to be understood that the above description and the accompanying Figures are only intended to teach the best way known to the inventors to make and use the invention. It will be apparent to a person skilled in the art that the inventive concept can be implemented in various ways. The above-described embodiments of the invention may thus be modified or varied, without departing from the invention, as appreciated by those skilled in the art in light of the above teachings. It is therefore to be understood that the invention and its embodiments are not limited to the examples described above but may vary within the scope of the claims and their equivalents.

The invention claimed is:

1. An electronics enclosure arrangement for an electric device, said electric device including one or more circuit boards and electronics components assembled on said one or more circuit boards, wherein said electronics enclosure arrangement comprises:
an electronics enclosure cover; and
an at least one volume element part arranged in a space between said electronics enclosure cover and said one or more circuit boards with said electronics components;
wherein said at least one volume element part comprises an at least one pillow structure sheet, said at least one pillow structure sheet having an at least partly hollow structure consisting of one or more pillows arranged inside said at least one pillow structure sheet.

2. The electronics enclosure arrangement according to claim 1, wherein said at least one volume element part comprises an at least one bubble structure sheet, said at least one bubble structure sheet having a sheet frame with one or more bubbles arranged within said sheet frame.

3. The electronics enclosure arrangement according to claim 2, wherein said one or more bubbles and/or said one or more pillows include inert gas.

4. The electronics enclosure arrangement according to claim 2, wherein said one or more bubbles and/or said one or more pillows include a mixture arranged for displacing the oxygen concentration in air.

5. The electronics enclosure arrangement according to claim 2, wherein said one or more bubbles and/or said one or more pillows include a mixture of chemical fire suppressants or a mixture arranged for reducing the temperature in a chemical reaction.

6. The electronics enclosure arrangement according to claim 2, wherein said one or more bubbles and/or said one or more pillows include a mixture of chemical substances arranged for chemically adsorbing hazardous gases.

7. The electronics enclosure arrangement according to claim 2, wherein said at least one volume element part comprises an at least one pillow structure sheet, said at least one pillow structure sheet having an at least partly hollow structure consisting of one or more pillows arranged inside said at least one pillow structure sheet.

8. The electronics enclosure arrangement according to claim 1, wherein said at least one volume element part comprises one or more bubble structure sheets and/or one or more pillow structure sheets, which sheets are cut to a specific size to fit in the space between said electronics enclosure cover and said one or more circuit boards with said electronics components.

9. The electronics enclosure arrangement according to claim 1, wherein said at least one volume element part comprises one or more bubble structure sheets and/or one or more pillow structure sheets, which sheets are stuffed, rolled or bent to fit in the space between said electronics enclosure cover and said one or more circuit boards with said electronics components.

10. The electronics enclosure arrangement according to claim 1, wherein said at least one volume element part is manufactured of pressure-proof material.

11. The electronics enclosure arrangement according to claim 1, wherein said at least one volume element part is manufactured of heat-resistant material.

12. The electronics enclosure arrangement according to claim 1, wherein said at least one volume element part is manufactured of insulating material.

13. The electronics enclosure arrangement according to claim 1, wherein said at least one volume element part is manufactured of a lightweight material.

14. An electric device, wherein said electric device comprises:
one or more circuit boards and electronics components assembled on said one or more circuit boards; and
an electronics enclosure arrangement, which includes:
an electronics enclosure cover; and
an at least one volume element part arranged in a space between said electronics enclosure cover and said one or more circuit boards with said electronics components;
wherein said at least one volume element part comprises an at least one pillow structure sheet, said at least one pillow structure sheet having an at least partly hollow structure consisting of one or more pillows arranged inside said at least one pillow structure sheet.

15. The electric device according to claim 14, wherein said electric device is a mobile electric drive device.

* * * * *